United States Patent
Maki et al.

(10) Patent No.: US 9,577,652 B2
(45) Date of Patent: Feb. 21, 2017

(54) ATOMIC RESONANCE TRANSITION DEVICE, ATOMIC OSCILLATOR, ELECTRONIC APPARATUS, AND MOVING OBJECT

(71) Applicant: Seiko Epson Corporation, Tokyo (JP)

(72) Inventors: Yoshiyuki Maki, Suwa (JP); Takuya Nakajima, Kofu (JP); Nobuhito Hayashi, Chino (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/723,935

(22) Filed: May 28, 2015

(65) Prior Publication Data

US 2015/0349790 A1    Dec. 3, 2015

(30) Foreign Application Priority Data

Jun. 2, 2014 (JP) ................................. 2014-114340

(51) Int. Cl.
*H03L 7/26* (2006.01)
*G04F 5/14* (2006.01)
*H01S 1/06* (2006.01)

(52) U.S. Cl.
CPC ................ *H03L 7/26* (2013.01); *G04F 5/145* (2013.01); *H01S 1/06* (2013.01)

(58) Field of Classification Search
CPC ............. H03L 7/26; G04F 5/14; G04F 5/145; H01S 1/06
USPC ................................................... 331/3, 94.1
See application file for complete search history.

(56) References Cited

U.S. PATENT DOCUMENTS

| 4,661,782 A | 4/1987 | Weidemann | |
|---|---|---|---|
| 5,457,430 A * | 10/1995 | English | H03L 7/26 331/3 |
| 5,657,340 A * | 8/1997 | Camparo | H03L 7/26 250/251 |
| 2005/0128014 A1 | 6/2005 | Matsuura et al. | |

FOREIGN PATENT DOCUMENTS

| JP | 55-132085 | 10/1980 |
|---|---|---|
| JP | 62-151002 | 7/1987 |
| JP | 63-281522 | 11/1988 |
| JP | 2005-175221 A | 6/2005 |
| JP | 2010-287937 A | 12/2010 |

* cited by examiner

*Primary Examiner* — Richard Tan
(74) *Attorney, Agent, or Firm* — Harness, Dickey & Pierce, P.L.C.

(57) ABSTRACT

An atomic resonance transition device includes a gas cell having an internal space that seals an alkali metal, a light emitter that emits excitation light containing a resonance light pair that causes the alkali metal to resonate toward the alkali metal, and a magnetic field generator that applies a magnetic field to the alkali metal. The excitation light diverges in a width direction in the internal space as the light travels from a side where the excitation light is incident toward a side where the excitation light exits, and the magnetic field from the magnetic field generator has a portion where the intensity of the magnetic field increases in the internal space with distance from the side where the excitation light is incident toward the side where the excitation light exits.

15 Claims, 12 Drawing Sheets

ATOMIC RESONANCE TRANSITION DEVICE, ATOMIC OSCILLATOR, ELECTRONIC APPARATUS, AND MOVING OBJECT

BACKGROUND

1. Technical Field

The present invention relates to an atomic resonance transition device, an atomic oscillator, an electronic apparatus, and a moving object.

2. Related Art

An atomic oscillator that oscillates based on energy transition in an alkali metal atom, such as rubidium and cesium is known to have a precise oscillation characteristic for a long period.

In general, the principle on which an atomic oscillator operates is classified roughly into a method using a double resonance phenomenon induced by light or a microwave and a method using coherent population trapping (CPT) induced by two light fluxes having wavelengths that are different from each other.

In an atomic oscillator based on each of the methods, it is typical that an alkali metal is sealed in a gas cell (an atom cell) and the gas cell is heated by a heater to a predetermined temperature to maintain the alkali metal in a constant gaseous state.

In an atomic oscillator of this type, a coil is disposed around the gas cell and caused to produce a steady magnetic field that causes a plurality of degenerated energy levels of the alkali metal atoms in the gas cell to split (Zeeman splitting), as disclosed in JP-A-2010-287937. For example, in the atomic oscillator described in JP-A-2010-287937, the magnetic field in the gas cell is homogenized for improved frequency stability.

As the size of an atomic oscillator has been required to be reduced in recent years, it has also been desired to reduce the size of the gas cell and the distance between the gas cell and a light source. A shorter distance between the gas cell and the light source, however, prevents a collimator lens from being disposed between the gas cell and the light source or the light in the gas cell from being collimated when a collimator lens is provided. As a result, a phenomenon called a light shift in which an increase in light level density increases the frequency even when the magnetic field in the gas cell is homogenized. This distorts the shape of an EIT signal produced by an atomic resonance phenomenon which results in a degradation in the frequency stability.

SUMMARY

An advantage of some aspects of the invention is to provide an atomic resonance transition device that allows improvement in frequency stability and further to provide an atomic oscillator, an electronic apparatus, and a moving object including the atomic resonance transition device.

The invention can be implemented as the following aspects or application examples:

Application Example 1

An atomic resonance transition device according to an application example of the invention includes an atom cell having an internal space that seals a metal, a light emitter that emits light containing a resonance light pair that causes the metal to resonate toward the metal, and a magnetic field applicator that applies a magnetic field to the metal, and the light diverges in a width direction in the internal space as the light travels from a side where the light is incident toward a side where the light exits, and the magnetic field has a portion where the intensity thereof increases in the internal space with distance from the side where the light is incident toward the side where the light exits.

According to the atomic resonance transition device described above, the light level density of the light from the light emitter decreases, whereas the intensity of the magnetic field increases in the internal space of the atom cell with distance from the side where the light is incident toward the side where the light exits. The relationship described above between the light level density and the intensity of the magnetic field allows frequency variation due to the light shift, which is a phenomenon in which the frequency increases as the light level density increases, and frequency variation due to Zeeman shift, which is a phenomenon in which the frequency increases as the magnetic flux density increases, to cancel or substantially cancel each other. Distortion of an EIT signal produced by an atomic resonance phenomenon can therefore be reduced, resulting in improvement in the frequency stability.

Application Example 2

In the atomic resonance transition device according to the application example of the invention, it is preferable that the intensity of the magnetic field continuously or intermittently increases in the internal space with distance from the side where the light is incident toward the side where the light exits.

The thus set magnetic field allows the frequency variation due to the light shift and the frequency variation due to Zeeman shift to cancel or substantially cancel each other in an efficient manner.

Application Example 3

In the atomic resonance transition device according to the application example of the invention, it is preferable that the magnetic field applicator includes a coil disposed along the direction in which the light travels.

The configuration described above, which is a relatively simple configuration, allows generation of a magnetic field having an intensity that continuously or intermittently increases in the internal space of the atom cell with distance from the side where the light is incident toward the side where the light exits.

Application Example 4

In the atomic resonance transition device according to the application example of the invention, it is preferable that the coil has a portion where the number of turns thereof increases with distance from the light emitter.

The configuration described above, which is a relatively simple configuration, allows generation of a magnetic field having an intensity that continuously or intermittently increases in the internal space of the atom cell with distance from the side where the light is incident toward the side where the light exits.

Application Example 5

In the atomic resonance transition device according to the application example of the invention, it is preferable that the coil has a portion where the distance between the coil and an axis of the light decreases with distance from the light emitter.

The configuration described above, which is a relatively simple configuration, allows generation of a magnetic field having an intensity that continuously or intermittently increases in the internal space of the atom cell with distance from the side where the light is incident toward the side where the light exits.

Application Example 6

In the atomic resonance transition device according to the application example of the invention, it is preferable that the magnetic field applicator includes a magnetic field adjustment member disposed between the coil and the internal space and having a magnetism shielding property.

The configuration described above, which is a relatively simple configuration, allows generation of a magnetic field having an intensity that continuously or intermittently increases in the internal space of the atom cell with distance from the side where the light is incident toward the side where the light exits.

Application Example 7

In the atomic resonance transition device according to the application example of the invention, it is preferable that the magnetic field adjustment member has a portion where the magnetism shielding property lowers with distance from the light emitter.

The configuration described above, which is a relatively simple configuration, allows generation of a magnetic field having an intensity that continuously or intermittently increases in the internal space of the atom cell with distance from the side where the light is incident toward the side where the light exits.

Application Example 8

In the atomic resonance transition device according to the application example of the invention, it is preferable that the angle of radiation of the light in the internal space is greater than 0° but smaller than or equal to 90°.

The angular setting described above allows the light from the light emitter to be efficiently used for an atomic resonance phenomenon even when the distance between the light emitter and the atom cell is shortened.

Application Example 9

An atomic oscillator according to an application example of the invention includes the atomic resonance transition device according to the application example of the invention.

An atomic oscillator having excellent frequency stability can thus be provided.

Application Example 10

An electronic apparatus according to an application example of the invention includes the atomic resonance transition device according to the application example of the invention.

An electronic apparatus including the atomic resonance transition device that allows improvement in the frequency stability can thus be provided.

Application Example 11

A moving object according to an application example of the invention includes the atomic resonance transition device according to the application example of the invention.

A moving object including the atomic resonance transition device that allows improvement in the frequency stability can thus be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

An atomic resonance transition device, an atomic oscillator, an electronic apparatus, and a moving object according to embodiments of the invention will be described below in detail with reference to the accompanying drawings.

1. Atomic Oscillator (Atomic Resonance Transition Device)

An atomic oscillator (an atomic oscillator including an atomic resonance transition device according to an embodiment of the invention) according to an embodiment of the invention will first be described. In the following sections, a description will be made of an example in which an atomic resonance transition device according to an embodiment of the invention is incorporated in an atomic oscillator using coherent population trapping, but the atomic resonance transition device according to the embodiment of the invention is not necessarily incorporated in such an atomic oscillator and can be incorporated, for example, in an atomic oscillator using a double resonance phenomenon, a magnetic sensor using coherent population trapping, and a quantum memory or any other similar device.

First Embodiment

Figure 1:
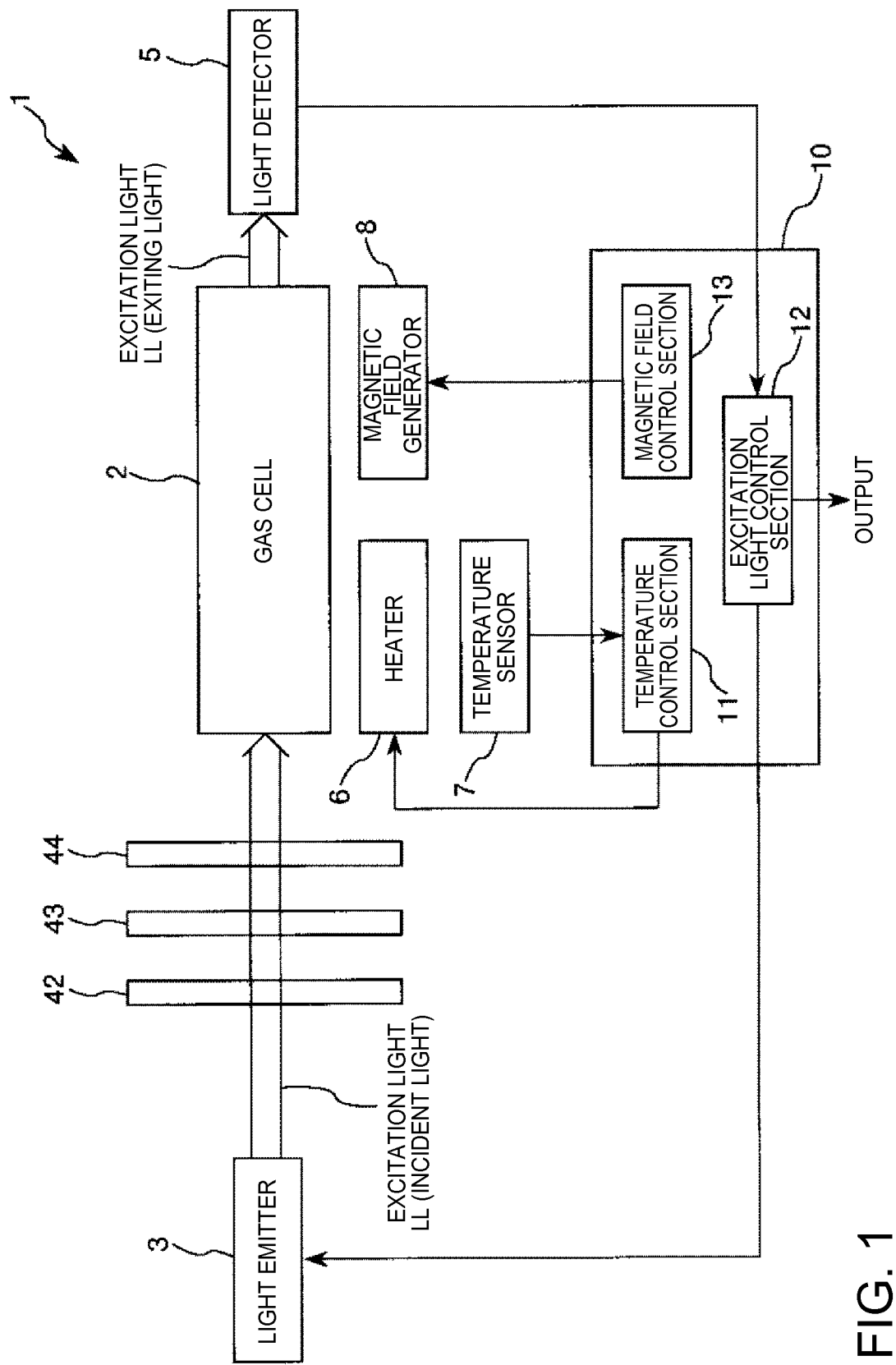
FIG. 1 is a schematic view showing an atomic oscillator (atomic resonance transition device) according to a first embodiment of the invention.
Figure 2:
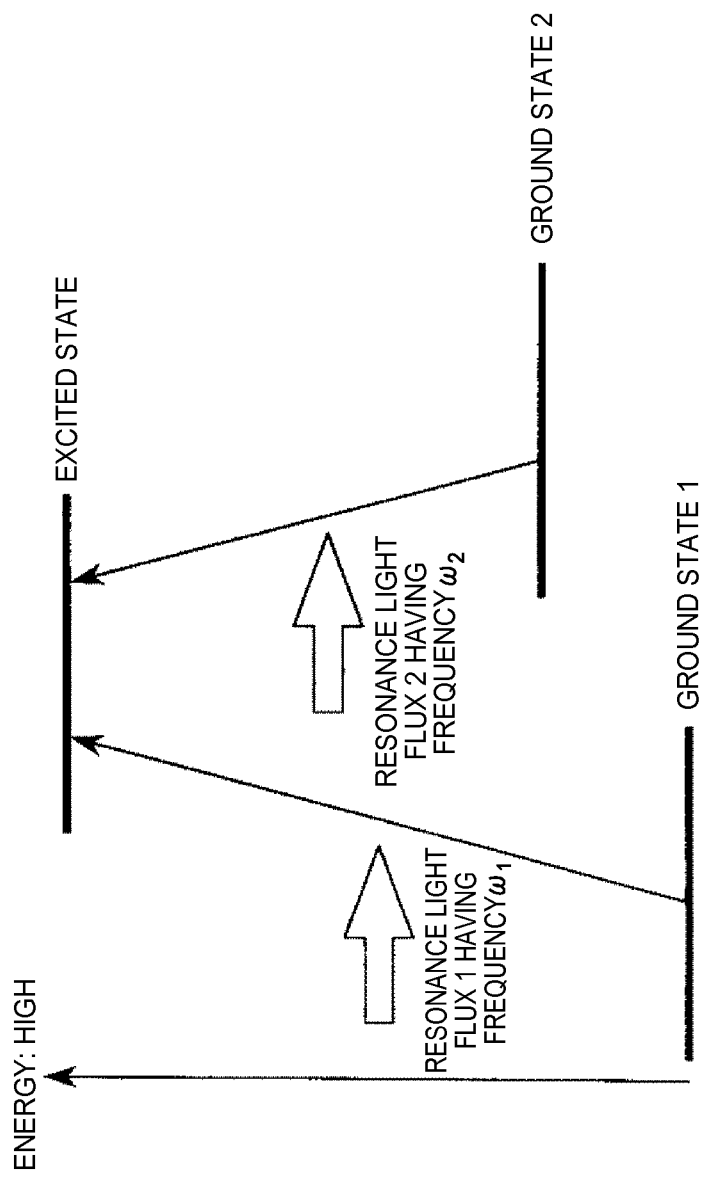
FIG. 2 describes the energy state of an alkali metal.
Figure 3:
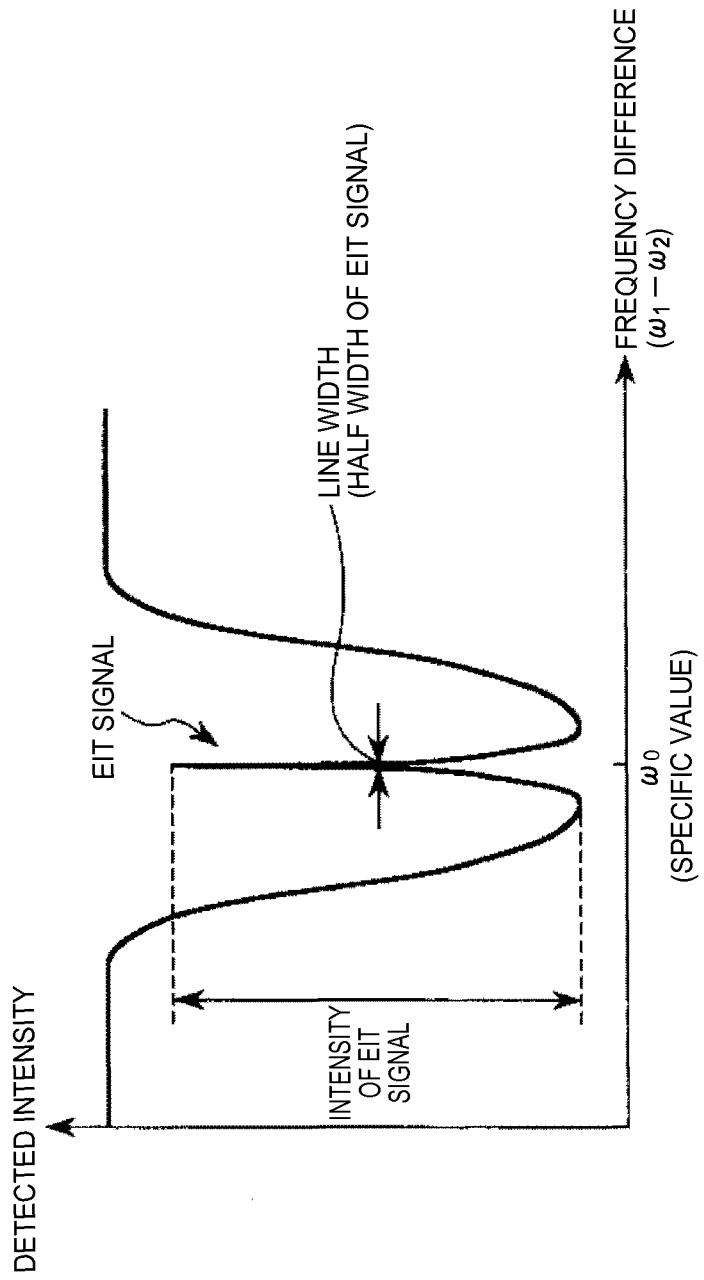
FIG. 3 shows a graph illustrating the relationship between the difference in frequency between two light fluxes emitted from a light emitter and the intensity of light detected with a light detector.

FIG. 1 is a schematic view showing an atomic oscillator (atomic resonance transition device) according to a first embodiment of the invention. FIG. 2 describes the energy state of an alkali metal. FIG. 3 shows a graph illustrating the relationship between the difference in frequency between two light fluxes emitted from a light emitter and the intensity of light detected with a light detector.

An atomic oscillator 1 shown in FIG. 1 is an atomic oscillator using coherent population trapping. The atomic oscillator 1 includes a gas cell 2 (atom cell), a light emitter 3, optical parts 42, 43, and 44, a light detector 5, a heater 6, a temperature sensor 7, a magnetic field generator 8, and a controller 10, as shown in FIG. 1.

The principle of the atomic oscillator 1 will first be briefly described.

In the atomic oscillator 1, the light emitter 3 emits excitation light LL toward the gas cell 2, and the light detector 5 detects the excitation light LL having passed through the gas cell 2, as shown in FIG. 1.

A gaseous alkali metal (metal atoms) is sealed in the gas cell 2, and an alkali metal has energy levels in a three-energy-level system and can have three states, two ground states having energy levels different from each other (ground states 1, 2) and an excited state. The ground state 1 is an energy state in which the energy level is lower than that in the ground state 2.

The excitation light LL emitted from the light emitter 3 contains two resonance light fluxes 1, 2 having frequencies different from each other. When the gaseous alkali metal described above is irradiated with the two resonance light fluxes 1, 2, the absorptivity (light transmittance) at which the alkali metal absorbs the resonance light fluxes 1, 2 changes with the difference between the frequency $\omega 1$ of the resonance light flux 1 and the frequency $\omega 2$ of the resonance light flux 2 ($\omega 1 - \omega 2$).

When the difference between the frequency $\omega 1$ of the resonance light flux 1 and the frequency $\omega 2$ of the resonance light flux 2 ($\omega 1 - \omega 2$) is equal to the frequency corresponding to the difference in energy between the ground state 1 and the ground state 2, no excitation from the ground states 1 and 2 to the excited state occurs. At this point, the resonance light fluxes 1, 2 are not absorbed by the alkali metal but pass therethrough. The phenomenon is called a CPT phenomenon or an electromagnetically induced transparency (EIT) phenomenon.

For example, assume that the light emitter 3 emits the resonance light flux 1 having a fixed frequency $\omega 1$ and the resonance light flux 2 having a changing frequency $\omega 2$. When the difference between the frequency $\omega 1$ of the resonance light flux 1 and the frequency $\omega 2$ of the resonance light flux 2 ($\omega 1 - \omega 2$) is equal to a frequency $\omega 0$ corresponding to the difference in energy between the ground state 1 and the ground state 2, the intensity detected with the light detector 5 steeply increases, as shown in FIG. 3. The steeply changing signal is detected as an EIT signal. The EIT signal has an eigenvalue determined by the type of the alkali metal. An oscillator can be configured by using the EIT signal.

Each of the portions of the atomic oscillator 1 will be sequentially described below in detail.

Gas Cell

The gas cell 2 contains (e.g., seals therein) a gaseous alkali metal, such as rubidium, cesium, and sodium. The gas cell 2 may further seal therein a rare gas, such as argon and neon, and an inert gas, such as nitrogen, as a buffer gas as required along with the alkali metal gas.

Although described later in detail, the gas cell 2 has a body portion having a through hole and a pair of window portions that block the openings of the through hole of the body portion. An internal space that seals the gaseous alkali metal is thus formed.

Light Emitter

The light emitter 3 (light source) has a function of emitting the excitation light LL, which excites the alkali metal atoms in the gas cell 2.

More specifically, the light emitter 3 emits the excitation light LL in the form of two light fluxes having frequencies different from each other, as described above, and can particularly emit the resonance light fluxes 1 and 2 described above. The resonance light flux 1 can excite the alkali metal (cause the alkali metal to resonate) in the gas cell 2 from the ground state 1 described above to the excited state. On the other hand, the resonance light flux 2 can excite the alkali metal (cause the alkali metal to resonate) in the gas cell 2 from the ground state 2 described above to the excited state.

The light emitter 3 is not limited to a specific light source and can be any light source that can emit excitation light, such as that described above. The light emitter 3 can, for example, be a vertical cavity surface emitting laser (VCSEL) or any other semiconductor laser.

The temperature of the light emitter 3 is adjusted to a predetermined value by a temperature adjustment device that is not shown (such as heating resistor and Peltier device).

Optical Parts

A plurality of optical parts 42, 43, and 44 may be provided on the optical path of the excitation light LL between the light emitter 3 and the gas cell 2 described above. The optical parts 42, 43, and 44 are arranged in this order from the side where the light emitter 3 is present toward the side where the gas cell 2 is present.

When the distance between the light emitter 3 and the gas cell 2 is relatively large, a lens may be disposed between the light emitter 3 and the gas cell 2. However, when the distance between the light emitter 3 and the gas cell 2 is shortened as the size of the atomic oscillator 1 is reduced, it is difficult to dispose a lens between the light emitter 3 and the gas cell 2, and even when a lens can be managed to be disposed therebetween, it is difficult for the lens to collimate the excitation light LL, resulting in divergent light in the gas cell 2.

The optical part 42 is a polarizer that can adjust the excitation light LL from the light emitter 3 in such a way that the polarization direction thereof is oriented in a predetermined direction.

The optical part 43 is a light attenuation filter (ND filter) that can adjust (attenuate) the intensity of the excitation light LL to be incident on the gas cell 2. Therefore, even when the light emitter 3 has a large output, the amount of excitation light incident on the gas cell 2 can be set at a desired value. In the present embodiment, the optical part 43 adjusts the intensity of the excitation light LL having passed through the optical part 42 described above and having the predetermined polarization direction.

The optical part 44 is a λ/4 plate that can convert the excitation light LL from the light emitter 3, which is linearly polarized light, into circularly polarized light (clockwise or counterclockwise circularly polarized light).

When the alkali metal atoms in the gas cell 2 that have undergone Zeeman-splitting under a magnetic field produced by the magnetic field generator 8 are irradiated with linearly polarized excitation light, the interaction between the excitation light and the alkali metal atoms causes the alkali metal atoms to be uniformly dispersed and present at a plurality of levels resulting from the Zeeman splitting. As a result, since the number of alkali metal atoms at a desired energy level is smaller than the number of alkali metal atoms at the other energy levels, the number of atoms that achieve a desired EIT phenomenon decreases, and the intensity of a desired EIT signal decreases accordingly, resulting in degradation in the oscillation characteristic of the atomic oscillator 1.

In contrast, when the alkali metal atoms in the gas cell 2 that have undergone the Zeeman splitting under a magnetic field produced by the magnetic field generator 8 are irradiated with circularly polarized excitation light, as will be described later, the interaction between the excitation light and the alkali metal atoms causes the number of alkali metal atoms at a desired energy level among the plurality of levels of the alkali metal atoms having undergone the Zeeman splitting to be greater than the number of alkali metal atoms at the other energy levels. The number of atoms that achieve a desired EIT phenomenon therefore increases and the intensity of a desired EIT signal increases accordingly, resulting in improvement in the oscillation characteristic (frequency stability, in particular) of the atomic oscillator 1.

Light Detector

The light detector 5 has a function of detecting the intensity of the excitation light LL (resonance light fluxes 1 and 2) having passed through the gas cell 2.

The light detector 5 is not limited to a specific component and can be any component that can detect excitation light, such as that described above. The light detector 5 can, for example, be a solar cell, a photodiode, or any other light detector (light receiving device).

Heater

The heater 6 (heating section) has a function of heating the gas cells 2 described above (more specifically, alkali metal in gas cell 2) and can therefore maintain the alkali metal in the gas cell 2 in a gaseous state at an appropriate density.

The heater 6 includes, for example, a heating resistor that generates heat when energized. The heating resistor may be provided in contact with the gas cell 2 or not in contact therewith.

For example, when the heating resistor is provided in contact with the gas cell 2, the heating resistor is provided on each of the pair of window portions of the gas cell 2. The configuration prevents the alkali metal atoms to condense on the window portions of the gas cell 2. As a result, the atomic oscillator 1 can show an excellent characteristic (oscillation characteristic) for a long period. The heating resistor is made of a material that transmits excitation light, specifically, for example, a transparent electrode material, such as ITO (indium tin oxide), IZO (indium zinc oxide), $In_3O_3$, $SnO_2$, Sb-containing $SnO_2$, Al-containing ZuO, and any other oxide. The heating resistor can, for example, be formed by using plasma CVD, thermal CVD, or any other chemical deposition (CVD), or vacuum evaporation or any other dry plating, or a sol-gel method.

When the heating resistor is provided in noncontact with the gas cell 2, heat may be transferred from the heating resistor to the gas cell 2 via a member made, for example, of a metal or ceramic material that excels in heat conductivity.

The heater 6 is not necessarily configured as described above and can be any of a variety of heaters capable of heating the gas cell 2. The heater 6 may be replaced with or may be used along with a Peltier device to heat the gas cell 2.

Temperature Sensor

The temperature sensor 7 detects the temperature of the heater 6 or the gas cell 2. The amount of heat generated by the heater 6 described above is controlled based on a result of the detection from the temperature sensor 7. The alkali metal atoms in the gas cell 2 can thus be maintained at a desired temperature.

The temperature sensor 7 is not necessarily located in a specific position and may be located, for example, on the heater 6 or on the outer surface of the gas cell 2.

The temperature sensor 7 is not limited to a specific component and can be a thermistor, a thermocouple, or any of a variety of other known temperature sensors.

Magnetic Field Generator (Magnetic Field Applicator)

The magnetic field generator 8 is a "magnetic field applicator" that applies a magnetic field to the alkali metal in the gas cell 2. The magnetic field generator 8 has a function of generating a magnetic field that causes a plurality of degenerated energy levels of the alkali metal in the gas cell 2 to undergo Zeeman splitting. The Zeeman splitting can expand the gap between the different degenerated energy levels of the alkali metal for improvement in resolution. As a result, the precision of the oscillation frequency of the atomic oscillator 1 can be increased.

The magnetic field generator 8 has a solenoid coil (coil 81, which will be described later) disposed so that it covers the gas cell 2 in the present embodiment, as will be described later in detail.

The magnetic field generated by the magnetic field generator 8 is a constant magnetic field (DC magnetic field), and an AC magnetic field may be superimposed on the DC magnetic field.

Controller

The controller 10 has a function of controlling the light emitter 3, the heater 6, and the magnetic field generator 8.

The controller 10 has an excitation light control section 12, which controls the frequencies of the resonance light fluxes 1 and 2 from the light emitter 3, a temperature control section 11, which controls the temperature of the alkali metal in the gas cell 2, and a magnetic field control section 13, which controls the magnetic field from the magnetic field generator 8.

The excitation light control section 12 controls the frequencies of the resonance light fluxes 1 and 2, which are emitted from the light emitter 3, based on a result of the detection from the light detector 5 described above. More specifically, the excitation light control section 12 controls the frequencies of the resonance light fluxes 1 and 2, which are emitted from the light emitter 3, in such a way that the frequency difference ($\omega 1-\omega 2$) described above is equal to the frequency $\omega 0$ specific to the alkali metal described above.

Although not shown, the excitation light control section 12 includes a voltage controlled quartz oscillator (oscillation circuit). The excitation light control section 12 causes the oscillation frequency of the voltage controlled quartz oscillator to undergo synchronization adjustment based on a result of the detection from the light detector 5 and outputs an output signal from the thus adjusted voltage controlled quartz oscillator as an output signal from the atomic oscillator 1.

For example, the excitation light control section includes a multiplier that is not shown but frequency-multiplies the output signal from the voltage controlled quartz oscillator, superimposes the signal multiplied by the multiplier (high-frequency signal) on a DC bias current to produce a drive signal, and provides the light emitter 3 with the drive signal as an input. In this case, when the voltage controlled quartz oscillator is so controlled that an EIT signal is detected with the light detector 5, the voltage controlled quartz oscillator outputs a signal having a desired frequency. The multiplication factor of the multiplier is, for example, $\omega 0/(2\times f)$, where f represents a desired frequency of the output signal from the atomic oscillator 1. As a result, when the oscillation frequency of the voltage controlled quartz oscillator is f, the light emitting device in the light emitter 3, such as a semiconductor laser, can be modulated by using the signal from the multiplier to emit two light fluxes having frequencies that provide the frequency difference ($\omega 1-\omega 2$) equal to $\omega 0$.

The temperature control section 11 controls electric conduction to the heater 6 based on a result of the detection from the temperature sensor 7 and can thus maintain the temperature of the gas cell 2 at a value within a desired temperature range. For example, the temperature of the gas cell 2 is adjusted to about 70° C. by the heater 6.

The magnetic field control section 13 controls electric conduction to the magnetic field generator 8 in such a way that the magnetic field generator 8 generates a constant magnetic field.

The thus configured controller 10 is provided, for example, in an IC chip implemented on a substrate.

The configuration of the atomic oscillator 1 has been briefly described.

Detailed Description of Gas Cell, Light Emitter, and Magnetic Field Applicator

Figure 4A:
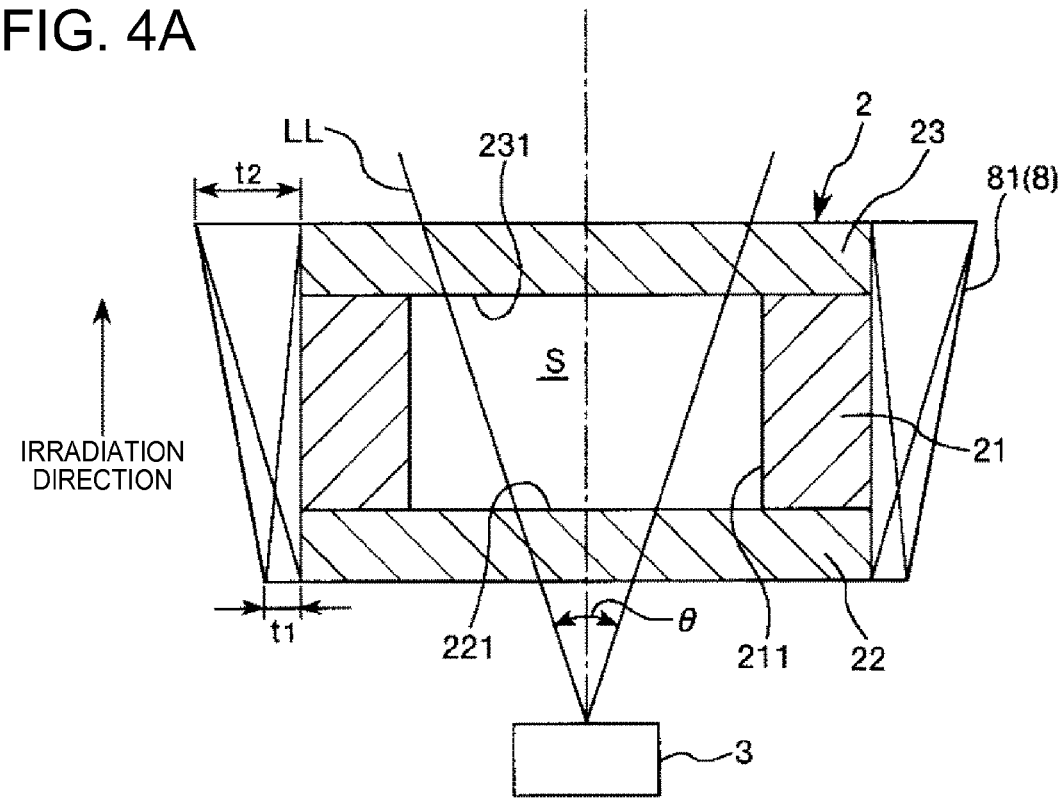
FIG. 4A is a diagrammatic cross-sectional view showing an atom cell, a light emitter, and a magnetic field applicator provided in the atomic oscillator shown in FIG. 1.
Figure 4B:
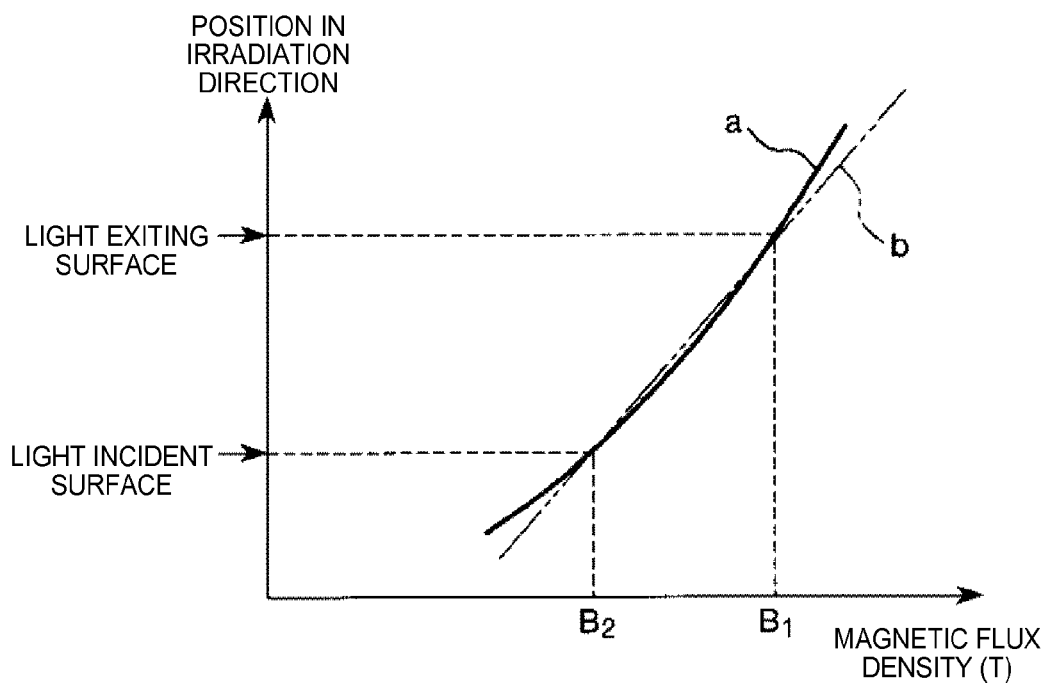
FIG. 4B shows graphs illustrating the distribution of magnetic field intensity (magnetic flux density) in the atom cell shown in FIG. 4A.
Figure 5:
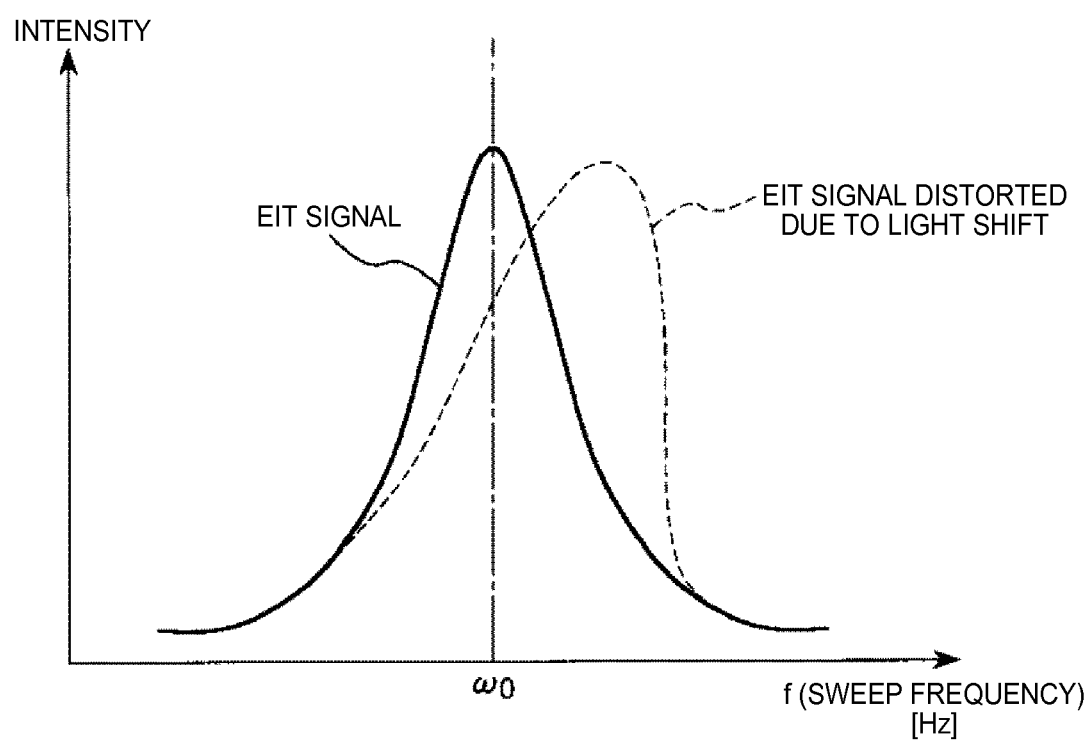
FIG. 5 shows a graph for describing a light shift.
Figure 6A:
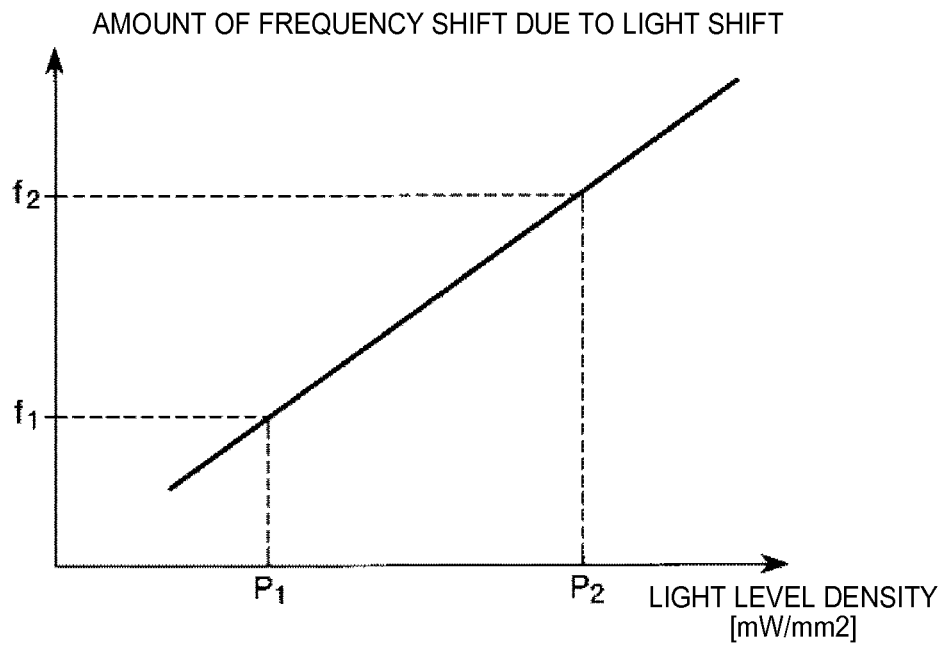
FIG. 6A shows a graph illustrating the relationship between the light level density of light acting on a metal in the atom cell and the amount of frequency shift (light shift)
Figure 6B:
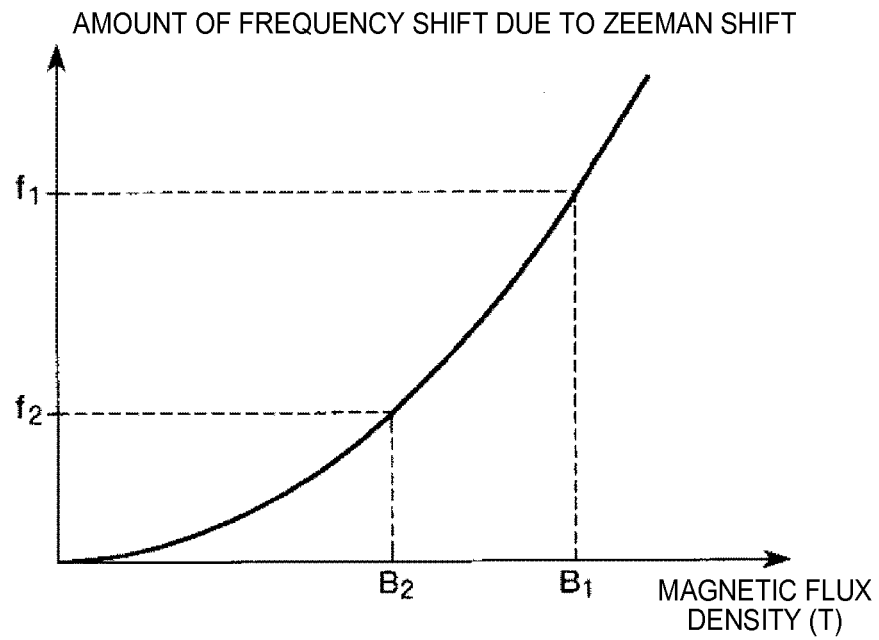
FIG. 6B shows a graph illustrating the relationship between the magnetic flux density of a magnetic field acting on the metal in the atom cell and the amount of frequency shift (Zeeman shift).

FIG. 4A is a diagrammatic cross-sectional view showing the atom cell, the light emitter, and the magnetic field applicator provided in the atomic oscillator shown in FIG. 1, and FIG. 4B shows graphs illustrating the distribution of magnetic field intensity (magnetic flux density) in the atom cell shown in FIG. 4A. FIG. 5 shows graphs for describing the light shift. FIG. 6A shows a graph illustrating the relationship between the light level density of the light acting on the metal in the atom cell and the amount of frequency shift (light shift), and FIG. 6B shows a graph illustrating the relationship between the magnetic flux density of the magnetic field acting on the metal in the atom cell and the amount of frequency shift (Zeeman shift). In the following description, the upper side in FIG. 4A is called "upward" and the lower side in FIG. 4A is called "downward" for ease of description.

The gas cell 2 has a body portion 21 and a pair of window portions 22 and 23 so provided that they sandwich the body portion 21, as shown in FIG. 4A. In the gas cell 2, the body portion 21 is disposed between the pair of window portions 22 and 23, and the body portion 21 and the pair of window portions 22 and 23 form (configure) an internal space S, which seals the gaseous alkali metal therein.

In a more specific description, the body portion 21 has a plate-like shape having an upward/downward thickness direction, and the body portion 21 is provided with a through hole 211, which passes through the body portion 21 in the thickness direction thereof (upward/downward direction).

The body portion 21 is not necessarily made of a specific material and can be made, for example, of a glass material, quartz, a metal material, a resin material, or a silicon material. Among these materials, a glass material, quartz, or a silicon material is preferably used, and a silicon material is more preferably used. Using any of the materials described above allows easy, very precise formation of the body portion 21 by using etching and other micro-processing technologies even when a small gas cell 2 having a width and height of 10 mm or smaller is formed. In particular, using silicon allows etching-based micro-processing. Forming the body portion 21 by using silicon therefore allows the body portion 21 to be simply and precisely formed even when the size of the gas cell 2 is reduced. Further, the window portions 22 and 23 are typically made of glass, but silicon is superior to glass in terms of heat conductivity. Using silicon therefore allows the body portion 21 to have an excellent heat dissipation property. On the other hand, when the window portions 22 and 23 are made of glass, the body portion 21 and the window portions 22 and 23 can be bonded to each other more simply in an airtight manner by using anodic bonding, whereby the gas cell 2 can have excellent reliability.

The window portion 22 is bonded to the lower surface of the body portion 21, and the window portion 23 is bonded to the upper surface of the body portion 21. As a result, the lower-end side opening of the through hole 211 is blocked by the window portion 22, and the upper-end side opening of the through hole 211 is blocked by the window portion 23.

A method for bonding the body portion 21 and the window portions 22, 23 to each other is determined in accordance with the materials of which these components are made. The method is not limited to a specific method and can be any method that allows airtight bonding. The method can, for example, be a bonding method using an adhesive, a direct bonding method, an anodic bonding method, or a surface activation bonding method. Among these methods, a direct bonding method or an anodic bonding method is preferably used. In this case, the body portion 21 and the window portions 22, 23 can be simply bonded to each other in an airtight manner, whereby the gas cell 2 can have excellent reliability.

The window portions 22 and 23 bonded to the body portion 21 as described above transmit the excitation light from the light emitter 3 described above. The window portion 22, which is one of the window portions, is a light-incident-side window portion on which the excitation light LL toward the internal space S in the gas cell 2 is incident, and the window portion 23, which is the other one of the window portions, is a light-exiting-side window portion through which the excitation light LL from the internal space S in the gas cell 2 exits. Each of the window portions 22 and 23 has a plate-like shape.

The window portions 22 and 23 are not necessarily made of a specific material and may be made of a material that transmits excitation light, such as that described above. The window portions 22 and 23 are made, for example, of a glass material or quartz, and a glass material is preferably used. Window portions 22 and 23 that transmit the excitation light can thus be achieved. When the body portion 21 is made of silicon, and the window portions 22 and 23 are made of a glass material, the body portion 21 and the window portions 22, 23 can be more simply bonded to each other in an airtight manner by using anodic bonding, whereby the gas cell 2 can have excellent reliability. Depending on the thickness of the window portions 22 and 23 and the intensity of the excitation light, the body portion 21 and the window portions 22, 23 can be bonded to each other by using direct bonding or anodic bonding.

The internal space S, which is the space in the through hole 211, which is blocked by the thus configured window portions 22 and 23, primarily accommodates the gaseous alkali metal. The gaseous alkali metal accommodated in the internal space S is excited by the excitation light LL. That is, at least part of the internal space S forms a "light passage space" through which the excitation light LL passes. In the present embodiment, the internal space S has a circular cross-sectional shape, and the light passage space has a cross-sectional shape similar to the cross-sectional shape of the internal space S (that is, circular shape) and is set to be slightly smaller than the cross section of the internal space S. The internal space S does not necessarily have a circular cross-sectional shape and may, for example, have a rectangular, pentagonal, or any polygonal shape or an elliptical shape.

As described above, the excitation light LL from the light emitter 3 is incident on the gas cell 2 having the configuration described above, and the excitation light LL diverges in the internal space S in the width direction with distance from the side where the excitation light LL is incident toward the side where the excitation light LL exits, as shown in FIG. 4A.

The angle of radiation of the excitation light LL in the internal space S, that is, the angle of radiation θ of the excitation light LL emitted from the light emitter 3 in the present embodiment is preferably greater than 0° but smaller than or equal to 90°, more preferably greater than or equal to 10° but smaller than or equal to 60°, still further preferably greater than or equal to 20° but smaller than or equal to 40°. The angular setting allows the excitation light LL from the light emitter 3 to be efficiently used for an atomic resonance phenomenon even when the distance between the light emitter 3 and the gas cell 2 is shortened.

A coil 81 is wound around the gas cell 2 along the circumferential direction of the body portion 21, as shown in FIG. 4A. The coil 81 is a solenoid coil disposed along the direction in which the excitation light LL travels in the internal space S (irradiation direction shown in FIG. 4A).

When the excitation light LL travels while diverging in the internal space S as described above, and if the magnetic flux density of the magnetic field from the coil 81 is uniform in the internal space S, the EIT signal produced by the atomic resonance phenomenon is undesirably (asymmetrically) deformed due to a phenomenon called the light shift, as shown in FIG. 5, resulting in degradation in the frequency stability.

To avoid the situation described above, the number of turns of the coil 81 is increased in correspondence with a distance away from the light emitter 3. Further, the outer diameter of the coil 81 is increased accordingly with distance from the light emitter 3. In the present embodiment, the outer diameter of the coil 81 is increased at a fixed rate with distance from the light emitter 3. Further, the thickness t1 of the coil 81 on the side where the window portion 22 is present is smaller than the thickness t2 of the coil 81 on the side where the window portion 23 is present.

The magnetic field generated by the coil 81 has a portion in which the intensity of the magnetic field increases in the internal space S with distance from the side where the excitation light LL is incident toward the side where the excitation light LL exits, as indicated by the a solid line "a" or a chain double dashed line "b" shown in FIG. 4B. More specifically, the intensity of the magnetic field from the coil 81 continuously increases in the internal space S with distance from the side where the excitation light LL is incident toward the side where the excitation light LL exits. As a result, the light level density of the light from the light emitter 3 decreases, whereas the intensity of the magnetic field increases in the internal space S of the gas cell 2 with distance from the side where the excitation light LL is incident toward the side where the excitation light LL exits.

The relationship described above between the light level density of the excitation light LL and the magnetic flux density of the magnetic field from the coil 81 allows frequency variation due to the light shift (Stark shift), which is a phenomenon in which the frequency increases as the light level density increases as shown in FIG. 6A, and frequency variation due to Zeeman shift, which is a phenomenon in which the frequency increases as the magnetic flux density increases as shown in FIG. 6B, to cancel or substantially cancel each other. Distortion of the EIT signal produced by the atomic resonance phenomenon can therefore be reduced, resulting in improvement in the frequency stability.

The coil 81, which generates the magnetic field described above, can be readily manufactured because the coil 81 has a relatively simple configuration in which the number of turns of the coil increases with distance from the light emitter 3.

The thickness of the wire that forms the coil 81 may be fixed or may increase with the position from the light emitter 3. In the latter case, the magnetic field from the coil 81 can be efficiently increased in the internal space S with distance from the side where the excitation light LL is incident toward the side where the excitation light LL exits.

Further, let $f_2(P_2)$ be the amount of frequency shift due to the light shift at a light incident surface 221 in the internal space S on which the excitation light LL is incident, $f_1(P_1)$ be the amount of frequency shift due to the light shift at a light exiting surface 231 in the internal space S through which the excitation light LL exits, $f_2(B_2)$ be the amount of frequency shift due to Zeeman shift at the light incident surface 221 in the internal space S on which the excitation light LL is incident, and $f_1(B_1)$ be the amount of frequency shift due to Zeeman shift at the light exiting surface 231 in the internal space S through which the excitation light LL exits, and the amounts of frequency shift are preferably so set that $[f_2(P_2)+f_2(B_2)]$ is equal to $[f_1(P_1)+f_1(B_1)]$. Specifically, the ratio of $[f_2(P_2)+f_2(B_2)]$ to $[f_1(P_1)+f_1(B_1)]$ is preferably greater than or equal to 0.9 but smaller than or equal to 1.1, more preferably greater than or equal to 0.95 but smaller than or equal to 1.05, still more preferably greater than or equal to 0.98 but smaller than or equal to 1.02. The setting described above allows the frequency variation due to the light shift and the frequency variation due to Zeeman shift to cancel or substantially cancel each other in an effective manner.

The amount of frequency shift due to the light shift changes linearly as shown in FIG. 6A, whereas the amount of frequency shift due to Zeeman shift changes quadratically as shown in FIG. 6B. The magnetic field from the coil 81 may change linearly in the internal space S as indicated by the chain double dashed line "b" in FIG. 4B but preferably changes quadratically to correct Zeeman shift linearly as indicated by the solid line "a" in FIG. 4B. As a result, the frequency variation due to the light shift and the frequency variation due to Zeeman shift cancel or substantially cancel each other in an effective manner.

Second Embodiment

A second embodiment of the invention will next be described.

Figure 7:
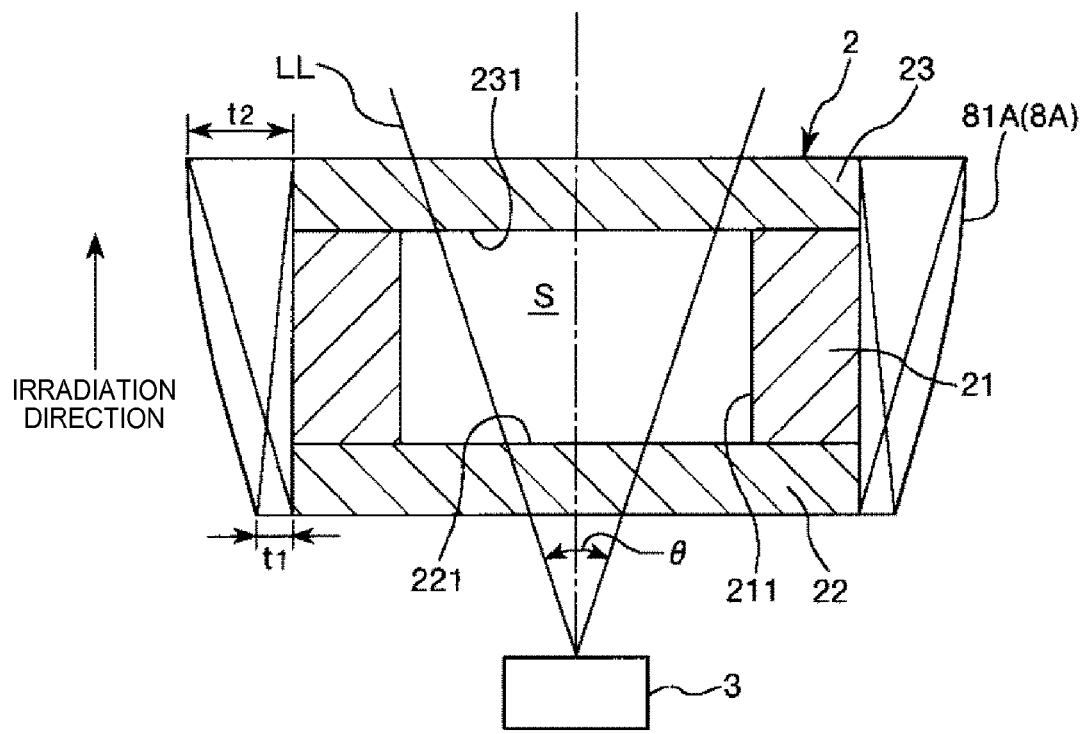
FIG. 7 is a diagrammatic cross-sectional view showing an atom cell, a light emitter, and a magnetic field applicator according to a second embodiment of the invention.

FIG. 7 is a diagrammatic cross-sectional view showing an atom cell, a light emitter, and a magnetic field applicator according to the second embodiment of the invention.

The present embodiment is the same as the first embodiment described above except that the coil provided in the magnetic field applicator is differently configured.

The following description will be made primarily on a difference between the second embodiment and the embodiment described above, and the same items are not described.

A magnetic field generator 8A (magnetic field applicator) in the present embodiment has a coil 81A, which is wound along the circumferential direction of the body portion 21 of the gas cell 2, as shown in FIG. 7. The number of turns of the coil 81A increases with distance from the light emitter 3 in such a way that the outer diameter of the coil 81A quadratically increases with distance from the light emitter 3. The magnetic field from the coil 81A in the internal space S is therefore changed quadratically as indicated by the chain double dashed light "b" in FIG. 4B in order to correct Zeeman shift linearly, whereby the frequency variation due to the light shift and the frequency variation due to Zeeman shift cancel or substantially cancel each other in an effective manner.

The second embodiment described above also allows improvement in the frequency stability.

Third Embodiment

A third embodiment of the invention will next be described.

Figure 8:
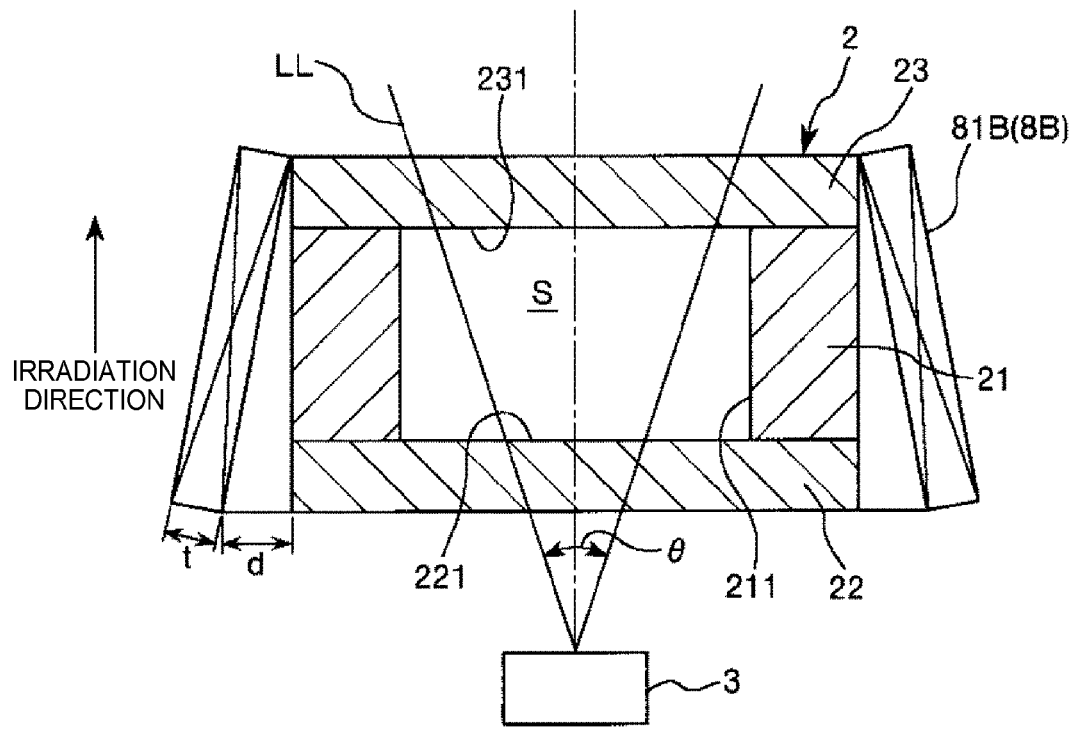
FIG. 8 is a diagrammatic cross-sectional view showing an atom cell, a light emitter, and a magnetic field applicator according to a third embodiment of the invention.

FIG. 8 is a diagrammatic cross-sectional view showing an atom cell, a light emitter, and a magnetic field applicator according to the third embodiment of the invention.

The present embodiment is the same as the first embodiment described above except that the coil provided in the magnetic field applicator is differently configured.

The following description will be made primarily on a difference between the third embodiment and the embodiments described above, and the same items are not described.

A magnetic field generator 8B (magnetic field applicator) in the present embodiment has a coil 81B, which is wound along the circumferential direction of the body portion 21 of the gas cell 2, as shown in FIG. 8. The coil 81B has a fixed thickness t, and the distance d between the coil 81B and the internal space S decreases with distance from the light emitter 3. As a result, the distance between the coil 81B and the axis of the excitation light LL decreases in the internal space S with distance from the light emitter 3. The configuration described above, which is a relatively simple configuration, also allows generation of a magnetic field having an intensity that continuously or intermittently increases in the internal space S of the gas cell 2 with distance from the side where the excitation light LL is incident toward the side where the excitation light LL exits, as in the first embodiment described above.

The third embodiment described above also allows improvement in the frequency stability.

Fourth Embodiment

A fourth embodiment of the invention will next be described.

Figure 9:
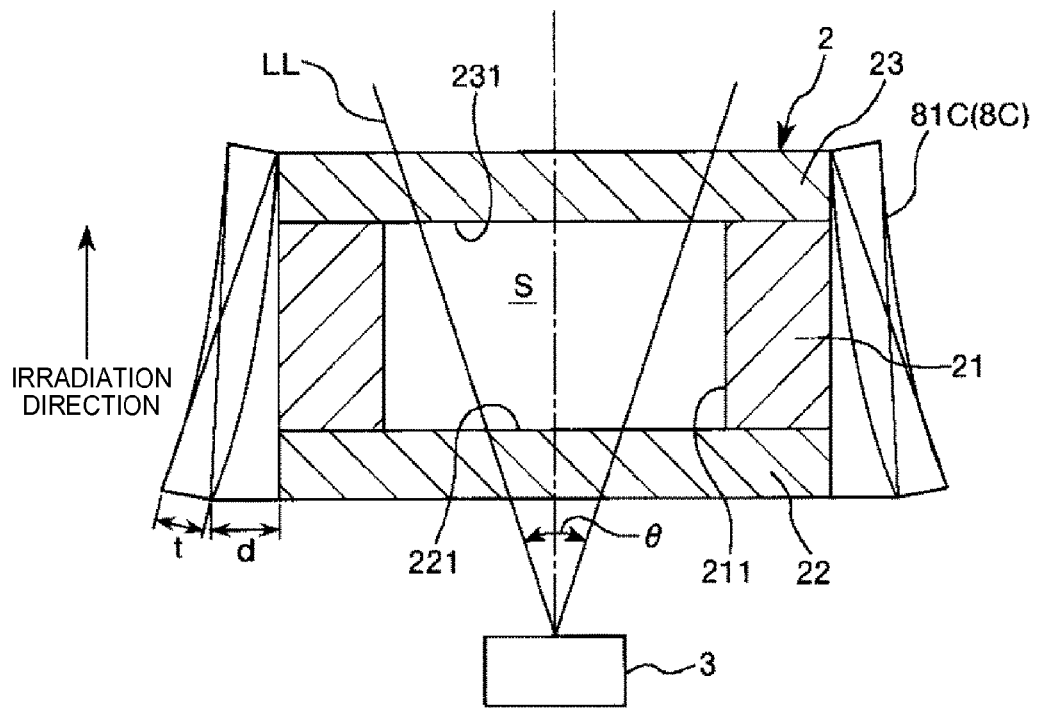
FIG. 9 is a diagrammatic cross-sectional view showing an atom cell, a light emitter, and a magnetic field applicator according to a fourth embodiment of the invention.

FIG. 9 is a diagrammatic cross-sectional view showing an atom cell, a light emitter, and a magnetic field applicator according to the fourth embodiment of the invention.

The present embodiment is the same as the first embodiment described above except that the coil provided in the magnetic field applicator is differently configured.

The following description will be made primarily on a difference between the fourth embodiment and the embodiments described above, and the same items are not described.

A magnetic field generator 8C (magnetic field applicator) in the present embodiment has a coil 81C, which is wound along the circumferential direction of the body portion 21 of the gas cell 2, as shown in FIG. 9. The coil 81C has a fixed thickness t, and the distance d between the coil 81C and the internal space S quadratically decreases with distance from the light emitter 3. The distance between the coil 81C and the axis of the excitation light LL quadratically decreases in the internal space S with distance from the light emitter 3. The configuration described above, which is a relatively simple configuration, also allows generation of a magnetic field having an intensity that continuously or intermittently increases in the internal space S of the gas cell 2 with distance from the side where the excitation light LL is incident toward the side where the excitation light LL exits, as in the first embodiment described above. In particular, quadratically changing the distance between the coil 81C and the axis of the excitation light LL allows the magnetic field from the coil 81C to change quadratically in the internal space S as indicated by the chain double dashed line "b" in FIG. 4B in order to correct Zeeman shift linearly, whereby the frequency variation due to the light shift and the frequency variation due to Zeeman shift cancel or substantially cancel each other in an effective manner.

The fourth embodiment described above also allows improvement in the frequency stability.

Fifth Embodiment

A fifth embodiment of the invention will next be described.

Figure 10:
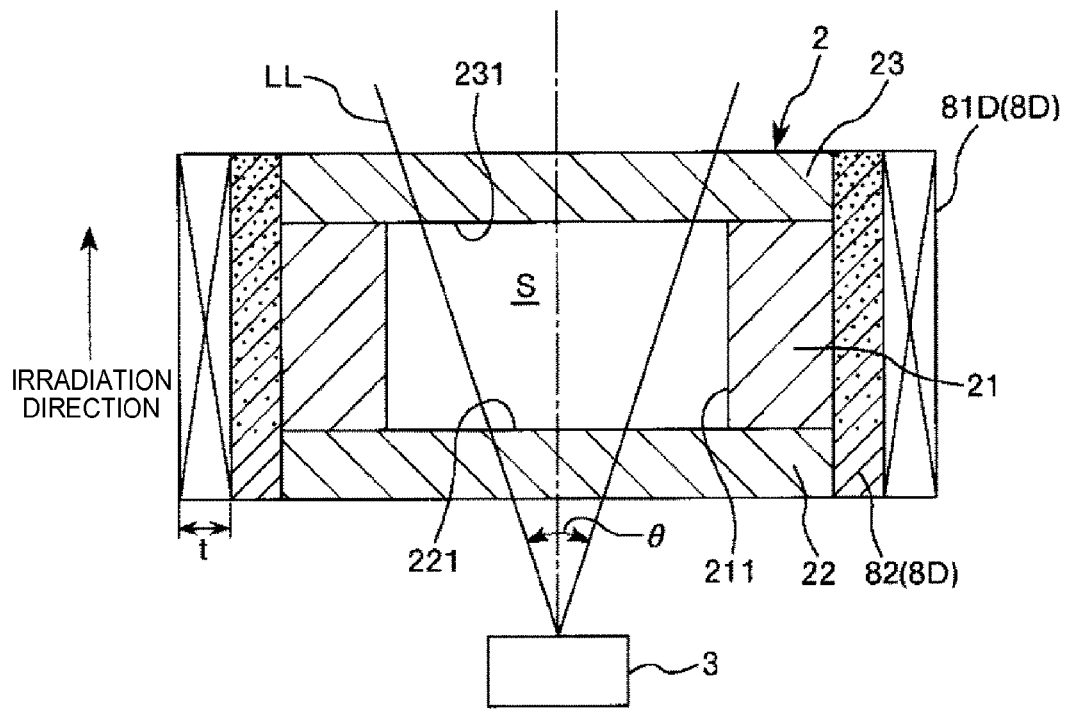
FIG. 10 is a diagrammatic cross-sectional view showing an atom cell, a light emitter, and a magnetic field applicator according to a fifth embodiment of the invention.

FIG. 10 is a diagrammatic cross-sectional view showing an atom cell, a light emitter, and a magnetic field applicator according to the fifth embodiment of the invention.

The present embodiment is the same as the first embodiment described above except that the coil provided in the magnetic field applicator is differently configured.

The following description will be made primarily on a difference between the fifth embodiment and the embodiments described above, and the same items are not described.

A magnetic field generator 8D (magnetic field applicator) in the present embodiment has a coil 81D, which is wound along the circumferential direction of the body portion 21 of the gas cell 2, and a magnetic field adjustment member 82, which is disposed between the gas cell 2 and the coil 81D, as shown in FIG. 10.

The coil 81D has a fixed thickness t, and the distance between the coil 81D and the axis of the excitation light LL with distance from the light emitter 3 is fixed.

The magnetic field adjustment member 82 has a magnetism shielding property (that is, capable of shielding magnetism). More specifically, the magnetism shielding property of the magnetic field adjustment member 82 lowers with distance from the light emitter 3. This configuration, which is a relatively simple configuration, allows generation of a magnetic field having an intensity that continuously or intermittently increases in the internal space S of the gas cell 2 with distance from the side where the excitation light LL is incident toward the side where the excitation light LL exits.

For example, the magnetic field adjustment member 82 is so configured that it contains a shielding material having a magnetism shielding property, and the density of the shielding material lowers with distance from the light emitter 3.

The magnetic field adjustment member 82 is not necessarily configured as described above, and the magnetic field adjustment member 82 may have a thickness that decreases with distance from the light emitter 3, or the arrangement of the magnetic field adjustment member 82 may be set as appropriate. Any of these configurations, each of which is a relatively simple configuration, also allows generation of a magnetic field having an intensity that continuously or intermittently increases in the internal space S of the gas cell 2 with distance from the side where the excitation light LL is incident toward the side where the excitation light LL exits.

The fifth embodiment described above also allows improvement in the frequency stability.

Sixth Embodiment

A sixth embodiment of the invention will next be described.

Figure 11:
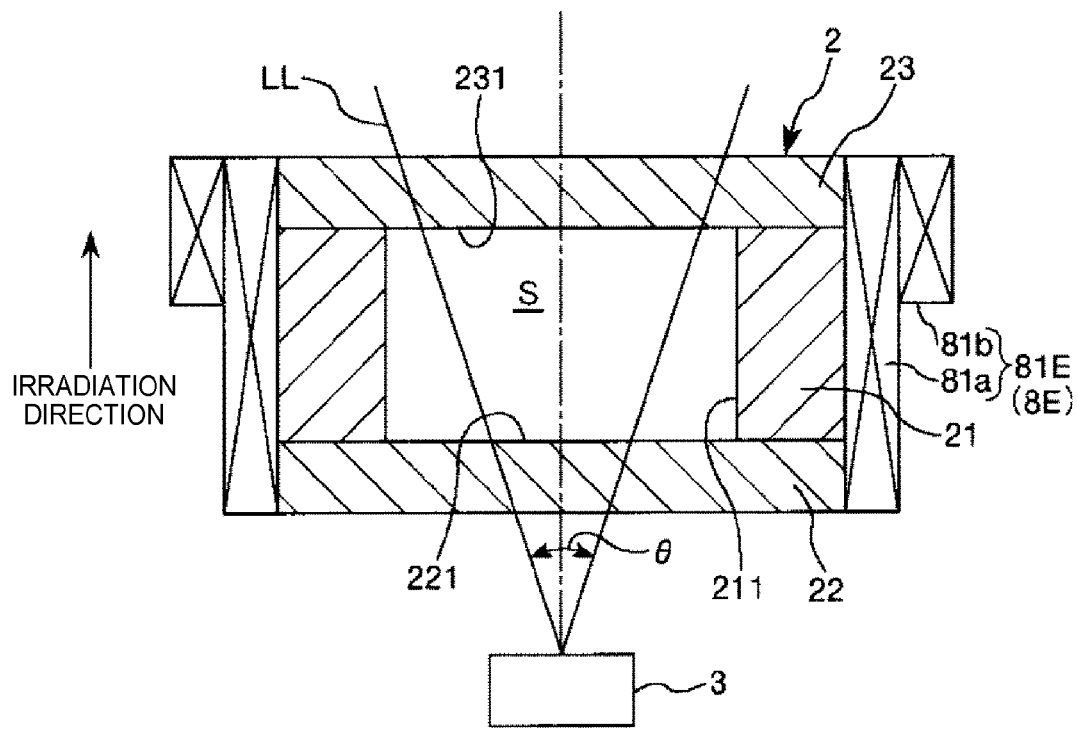
FIG. 11 is a diagrammatic cross-sectional view showing an atom cell, a light emitter, and a magnetic field applicator according to a sixth embodiment of the invention.

FIG. 11 is a diagrammatic cross-sectional view showing an atom cell, a light emitter, and a magnetic field applicator according to the sixth embodiment of the invention.

The present embodiment is the same as the first embodiment described above except that the coil provided in the magnetic field applicator is differently configured.

The following description will be made primarily on a difference between the sixth embodiment and the embodiments described above, and the same items are not described.

A magnetic field generator 8E (magnetic field applicator) in the present embodiment has a coil 81E, which is wound along the circumferential direction of the body portion 21 of the gas cell 2, as shown in FIG. 11. The coil 81E is formed of a coil 81a and a coil 81b, which is disposed in a portion outside the coil 81a.

The coil 81a is disposed over the entire portion between the window portions 22 and 23 of the gas cell 2, and the coil 81b is disposed in a portion shifted toward the window portion 23 of the gas cell 2. This configuration, which is a relatively simple configuration, also allows generation of a magnetic field having an intensity that continuously or intermittently increases in the internal space S of the gas cell 2 with distance from the side where the excitation light LL is incident toward the side where the excitation light LL exits. In particular, separately controlling currents caused to flow through the coils 81a and 81b allows a desired magnetic field to be relatively readily generated.

The sixth embodiment described above also allows improvement in the frequency stability.

Seventh Embodiment

A seventh embodiment of the invention will next be described.

Figure 12:
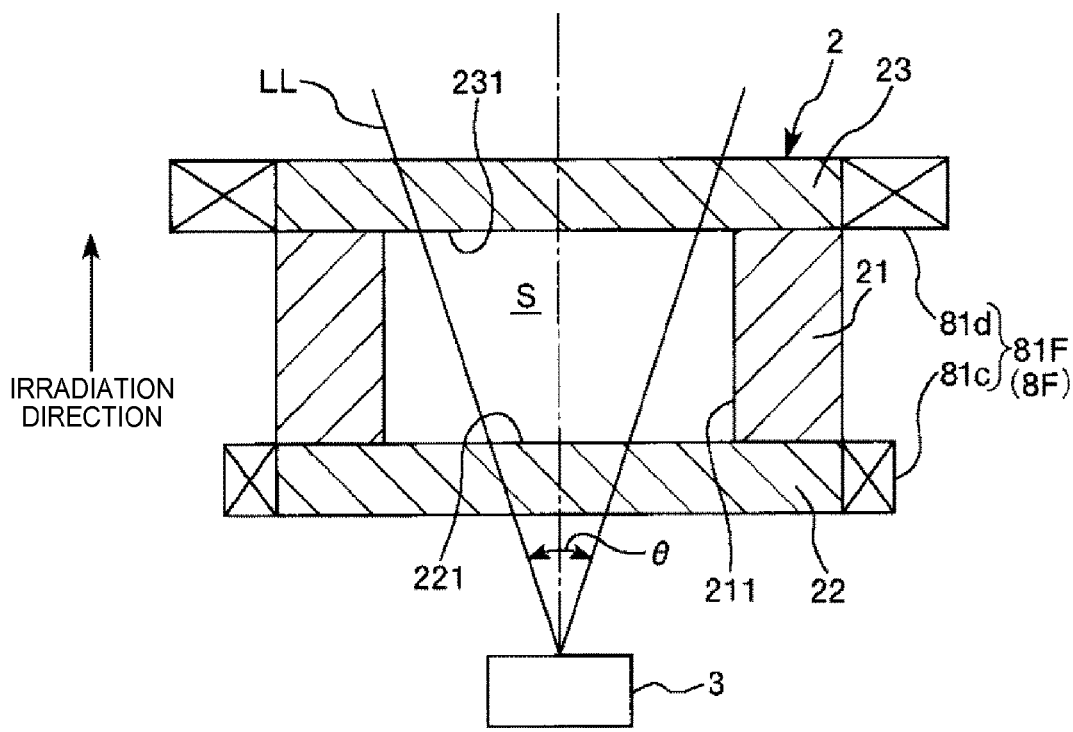
FIG. 12 is a diagrammatic cross-sectional view showing an atom cell, a light emitter, and a magnetic field applicator according to a seventh embodiment of the invention.

FIG. 12 is a diagrammatic cross-sectional view showing an atom cell, a light emitter, and a magnetic field applicator according to the seventh embodiment of the invention.

The present embodiment is the same as the first embodiment described above except that the coil provided in the magnetic field applicator is differently configured.

The following description will be made primarily on a difference between the seventh embodiment and the embodiments described above, and the same items are not described.

A magnetic field generator 8F (magnetic field applicator) in the present embodiment has a coil 81F, which is wound along the circumferential direction of the body portion 21 of the gas cell 2, as shown in FIG. 12. The coil 81F is a Helmholtz coil formed of a coil 81c, which is disposed on the side where the window portion 22 of the gas cell 2 is present, and a coil 81d, which is disposed on the side where the window portion 23 of the gas cell 2 is present.

In the present embodiment, the number of turns of the coil 81d is greater than the number of turns of the coil 81c. This configuration, which is a relatively simple configuration, also allows generation of a magnetic field having an intensity that continuously or intermittently increases in the internal space S of the gas cell 2 with distance from the side where the excitation light LL is incident toward the side where the excitation light LL exits, as in the first embodiment described above.

Further, separately controlling currents caused to flow through the coils 81c and 81d allows a desired magnetic field to be relatively readily generated. Even when the number of turns of the coil 81d is equal to the number of turns of the coil 81c, setting the current caused to flow through the coil 81d to be greater than the current caused to flow through the coil 81c allows generation of a magnetic field having an intensity that continuously or intermittently increases in the internal space S of the gas cell 2 with distance from the side where the excitation light LL is incident toward the side where the excitation light LL exits.

The seventh embodiment described above also allows improvement in the frequency stability.

Eighth Embodiment

An eighth embodiment of the invention will next be described.

Figure 13:
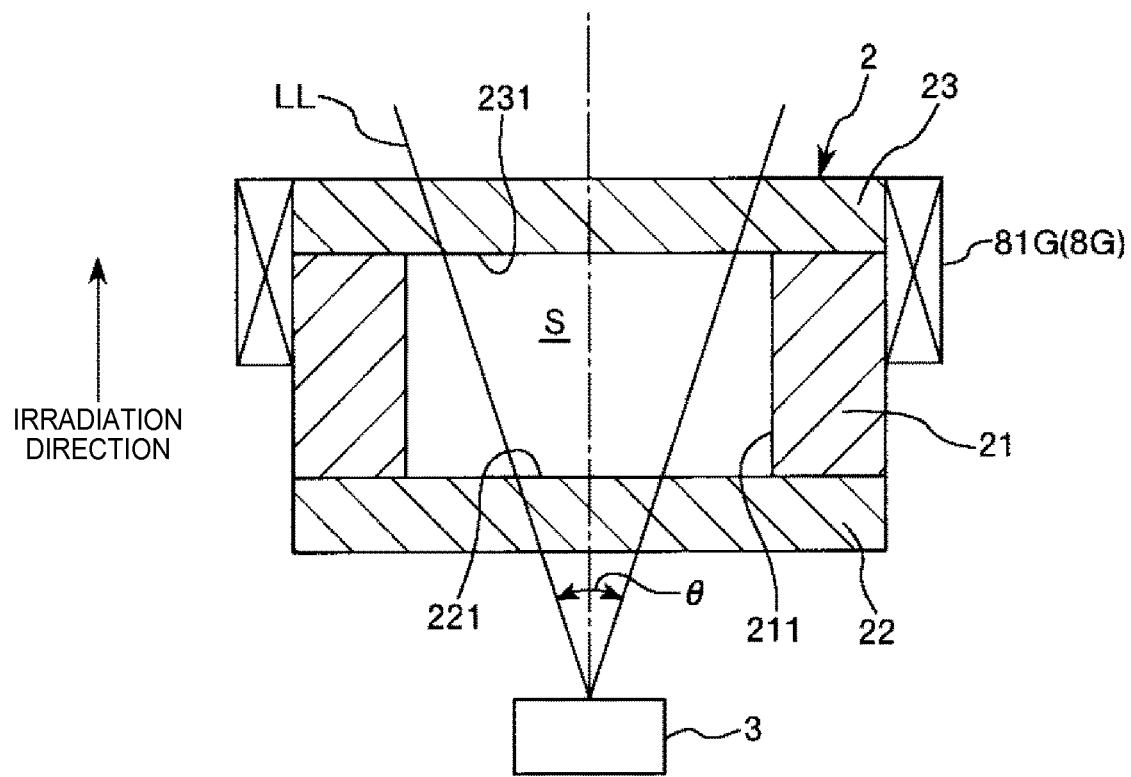
FIG. 13 is a diagrammatic cross-sectional view showing an atom cell, a light emitter, and a magnetic field applicator according to an eighth embodiment of the invention.

FIG. 13 is a diagrammatic cross-sectional view showing an atom cell, a light emitter, and a magnetic field applicator according to the eighth embodiment of the invention.

The present embodiment is the same as the first embodiment described above except that the coil provided in the magnetic field applicator is differently configured.

The following description will be made primarily on a difference between the eighth embodiment and the embodiments described above, and the same items are not described.

A magnetic field generator 8G (magnetic field applicator) in the present embodiment has a coil 81G, which is wound along the circumferential direction of the body portion 21 of the gas cell 2, as shown in FIG. 13. The coil 81G is disposed in a portion shifted toward the window portion 23 of the gas cell 2. This configuration, which is a relatively simple configuration, also allows generation of a magnetic field having an intensity that continuously or intermittently increases in the internal space S of the gas cell 2 with distance from the side where the excitation light LL is incident toward the side where the excitation light LL exits, as in the first embodiment described above.

The eighth embodiment described above also allows improvement in the frequency stability.

2. Electronic Apparatus

The atomic oscillator described above can be incorporated in a variety of electronic apparatus. The electronic apparatus have excellent reliability.

An electronic apparatus according to an embodiment of the invention will be described below.

Figure 14:
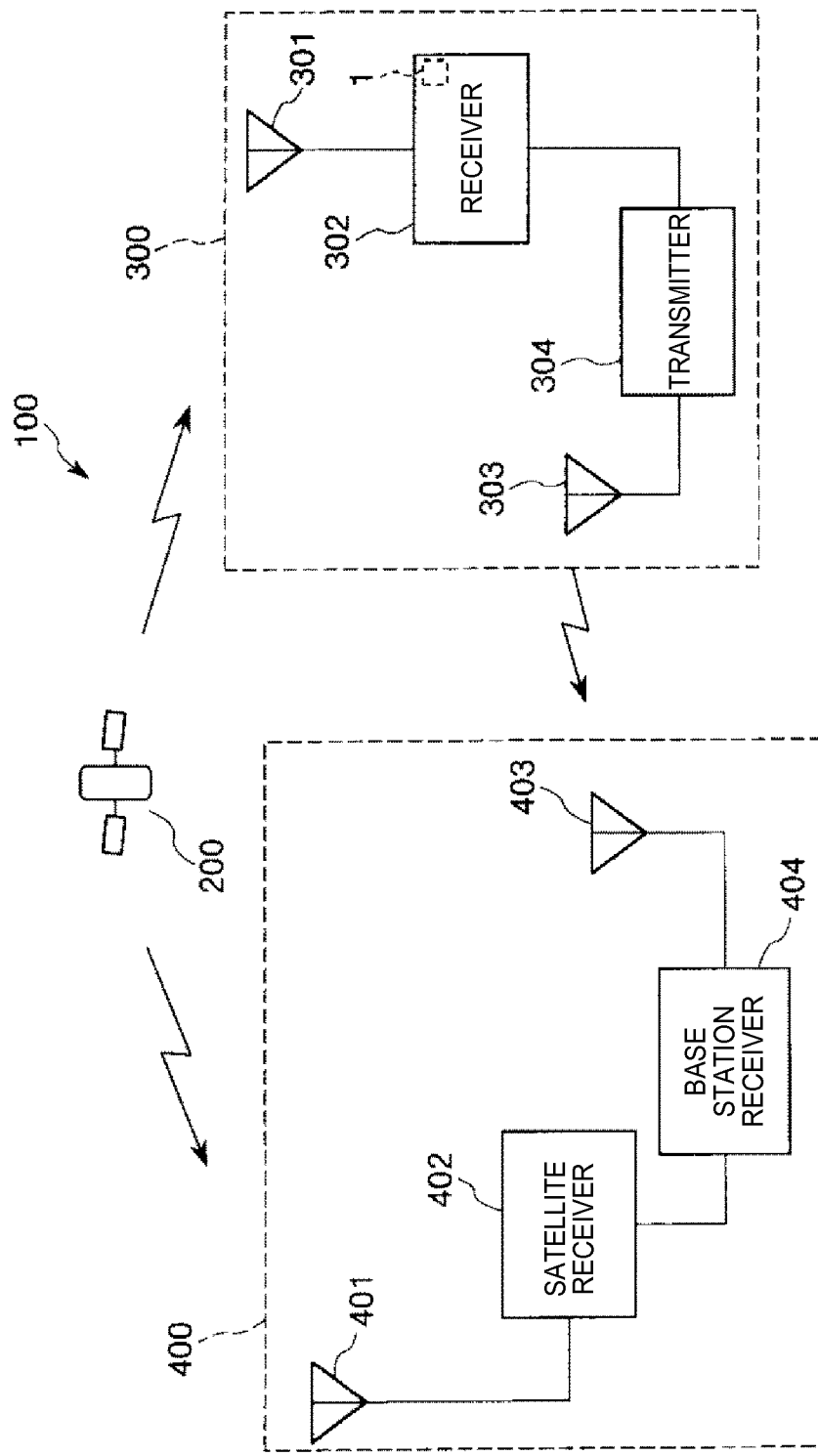
FIG. 14 shows a schematic configuration of a GPS-satellite-based positioning system using the atomic oscillator according to the embodiment of the invention.

FIG. 14 shows a schematic configuration of a GPS-satellite-based positioning system using the atomic oscillator according to the embodiment of the invention.

A positioning system 100 shown in FIG. 14 includes a GPS satellite 200, a base station apparatus 300, and a GPS receiver 400.

The GPS satellite 200 transmits positioning information (GPS signal).

The base station apparatus 300 includes a receiver 302, which receives the positioning information with precision from the GPS satellite 200, for example, via an antenna 301 installed at an electronic reference point (GPS continuous observation station), and a transmitter 304, which transmits the positioning information received by the receiver 302 via an antenna 303.

The receiver 302 is an electronic apparatus including the atomic oscillator 1 according to the embodiment of the invention described above as a reference frequency oscillation source. The thus configured receiver 302 has excellent reliability. Further, the positioning information received by the receiver 302 is transmitted by the transmitter 304 in real time.

The GPS receiver 400 includes a satellite receiver 402, which receives the positioning information from the GPS satellite 200 via an antenna 401, and a base station receiver 404, which receives the positioning information from the base station apparatus 300 via an antenna 403.

3. Moving Object

Figure 15:
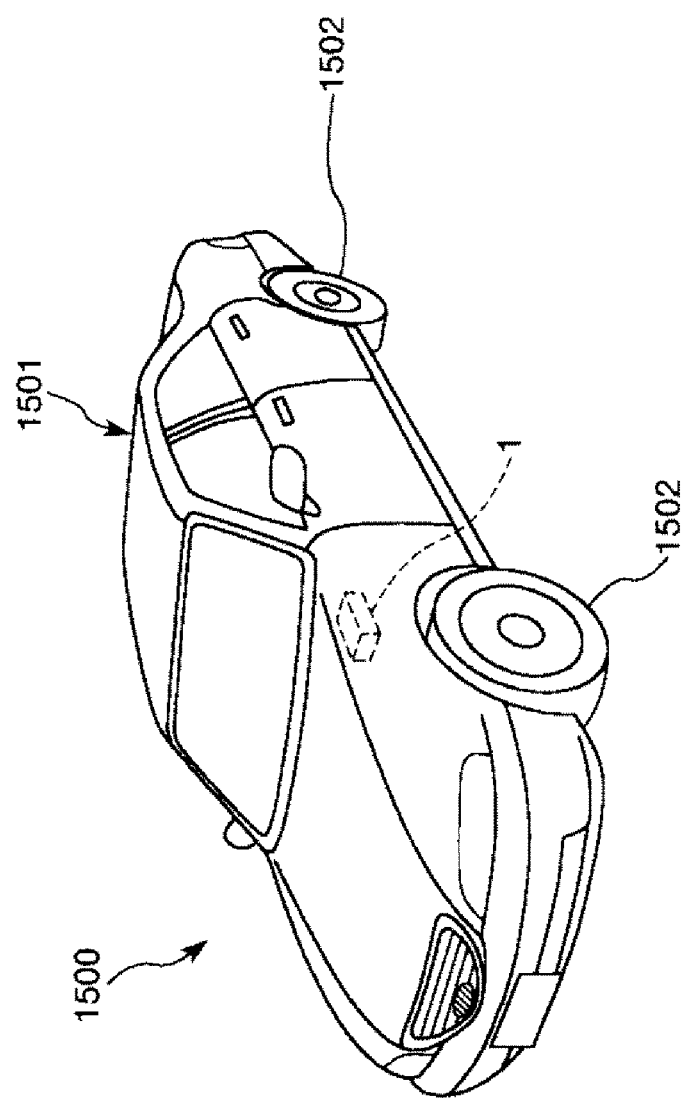
FIG. 15 shows an example of a moving object according to an embodiment of the invention.

FIG. 15 shows an example of a moving object according to an embodiment of the invention.

In FIG. 15, a moving object 1500 includes a vehicle body 1501 and four wheels 1502, and a power source (engine) that is not shown but is provided in the vehicle body 1501 rotates the wheels 1502. The thus configured moving object 1500 has the atomic oscillator 1 built therein.

The thus configured moving object has excellent reliability.

The electronic apparatus according to the embodiment of the invention is not limited to the electronic apparatus described above and can, for example, be a mobile phone, a digital still camera, an inkjet-type liquid ejection apparatus (inkjet printer, for example), a personal computer (mobile personal computer, laptop personal computer), a television receiver, a video camcorder, a video tape recorder, a car navigator, a pager, an electronic notepad (including electronic notepad having communication function), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, airplanes, and ships), a flight simulator, terrestrial digital broadcasting, and a cellular phone base station.

The atomic resonance transition device, the atomic oscillator, the electronic apparatus, and the moving object according to the embodiments of the invention have been described above with reference to the drawings, but the invention is not limited thereto.

The configuration of each portion in the invention can be replaced with an arbitrary configuration that provides the same function as that in the embodiments described above, and an arbitrary configuration can further be added.

Further, in the invention, arbitrary configurations in the embodiments described above may be combined with each other.

The entire disclosure of Japanese Patent Application No. 2014-114340 filed Jun. 2, 2014 is expressly incorporated by reference herein.

What is claimed is:

1. An atomic resonance transition device comprising:
   a cell having an internal space;
   a metal sealed within the internal space of the cell;
   a light emitter configured to emit light towards the metal, the light containing a resonance light pair configured to cause the metal to resonate; and
   a magnetic field applicator configured to apply a magnetic field to the metal,
   wherein the light diverges in a width direction in the internal space as the light travels from a light incident side of the cell toward a light exiting side of the cell,
   the magnetic field has a portion in the internal space that increases in intensity in accordance with distance from the light incident side toward the light exiting side,
   the magnetic field applicator includes a coil disposed along a travelling direction of the light, and
   the magnetic field applicator includes a magnetic field adjuster disposed between the coil and the internal space, and the magnetic field adjuster has a magnetism shielding property.

2. The atomic resonance transition device according to claim 1,
   wherein the increase in intensity of the portion of the magnetic field is continuous or intermittent.

3. The atomic resonance transition device according to claim 1,
   wherein the coil has a portion where a distance between an outer peripheral of the coil and an axis of the light increases as a distance from the light emitter increases.

4. The atomic resonance transition device according to claim 1,
   wherein the magnetic field adjuster has a portion where the magnetism shielding property reduces as a distance from the light emitter increases.

5. The atomic resonance transition device according to claim 1,
   wherein an angle of radiation of the light in the internal space is greater than 0° but smaller than or equal to 90°.

6. An atomic resonance transition device comprising:
   a cell including:
      a body having a through hole; and
      a first window sealed to a light incident side of the body; and
      a second window sealed to a light exiting side of the body so as to define a sealed internal space of the cell;
   a gaseous alkali metal sealed in the internal space of the cell;
   a light emitter configured to impinge excitation light upon the gaseous alkali metal, the excitation light containing two resonance light fluxes having different frequencies from each other;
   a magnetic field generator configured to apply a magnetic field to the gaseous alkali metal in the cell, the magnetic field being configured to cause a plurality of degenerated energy levels of the gaseous alkali metal to undergo Zeeman splitting; and a magnetic shield disposed outside of the body, wherein a light level density of the light from the light emitter decreases from the light incident side of the body to the light exiting side of the body, an intensity of the magnetic field increases from the light incident side of the body to the light exiting side of the body, the magnetic field generator further includes a coil wound around the cell in a circumferential direction of the body so as to be disposed along a travelling direction of the light through the internal space, and the magnetic shield is disposed between the coil and the body, and the magnetic shield having a magnetism shielding ability that reduces in effectiveness from the light incident side of the body to the light exiting side of the body.

7. The atomic resonance transition device according to claim 6, wherein the light diverges from the light incident side of the body to the light exiting side of the body.

8. The atomic resonance transition device according to claim 6, wherein a number of turns of the coil increases from the light incident side of the body to the light exiting side of the body.

9. The atomic resonance transition device according to claim 8, wherein an outer diameter of the coil increases from the light incident side of the body to the light exiting side of the body.

10. The atomic resonance transition device according to claim 9, wherein a first thickness of the coil at the light incident side of the body is smaller than a second thickness of the coil at the light exiting side of the body.

11. The atomic resonance transition device according to claim 6, wherein an outer diameter of the coil increases from the light incident side of the body to the light exiting side of the body.

12. The atomic resonance transition device according to claim 6, wherein a first thickness of the coil at the light incident side of the body is smaller than a second thickness of the coil at the light exiting side of the body.

13. The atomic resonance transition device according to claim 6, wherein a distance between the coil and a propagation axis of the light decreases from the light incident side of the body to the light exiting side of the body.

14. The atomic resonance transition device according to claim 6, further comprising a second coil disposed proximate the light exiting side of the body.

15. The atomic resonance transition device according to claim 6, wherein a distance between the coil and a propagation axis of the light quadratically changes.

* * * * *